United States Patent [19]
Schumacher

[11] Patent Number: 5,940,278
[45] Date of Patent: Aug. 17, 1999

[54] BACKING PLATE FOR GATE ARRAYS OR THE LIKE CARRIES AUXILIARY COMPONENTS AND PROVIDES PROBE ACCESS TO ELECTRICAL TEST POINTS

[75] Inventor: Richard A. Schumacher, Dallas, Tex.

[73] Assignee: Hewlett-Packard Company, Palo Alto, Calif.

[21] Appl. No.: 08/846,358

[22] Filed: Apr. 30, 1997

[51] Int. Cl.[6] .............................. H05K 1/11; H05K 1/14; G01R 31/04

[52] U.S. Cl. ........................ 361/769; 324/755; 324/765; 361/767; 361/790

[58] Field of Search .................................. 174/255, 261, 174/260; 257/700, 723, 724; 324/754–759, 761, 765; 361/744, 763, 764, 767, 768, 769, 771, 784, 790, 791, 803, 804; 439/66, 68, 74, 69, 82, 91, 330, 331, 591

[56] References Cited

U.S. PATENT DOCUMENTS

| | | | |
|---|---|---|---|
| 4,882,657 | 11/1989 | Braun ....................................... | 361/767 |
| 5,434,513 | 7/1995 | Fujii et al. ................................ | 324/765 |
| 5,477,160 | 12/1995 | Love ........................................ | 324/755 |
| 5,534,784 | 7/1996 | Lum et al. ................................ | 324/757 |

Primary Examiner—Donald Sparks
Attorney, Agent, or Firm—Edward L. Miller

[57] ABSTRACT

A VLSI IC's signals as they appear at the signal via pads on the back side of a mother board may be probed with the aid of a backing plate that is a piece of multi-layer printed circuit board material thick enough to be sufficiently stiff for the purpose. The multi-layer PCB backing plate has front side pads and vias in at least those locations in the LGA (of signal via pads) corresponding physically to signals that are of interest for probing, and if such a subset is unknown ahead of time, the entire LGA of signal vias pads may be represented in the vias. An LGA socket connects the front side vias of the backing plate to the LGA of signal vias on the back side of the mother board carrying the gate array or other IC. Thus, those signals that, in the absence of a backing plate, could be probed on the back side of the mother board can now still be probed at back side pads on the back side of the PCB backing plate, just as if that were the back side of the mother board. The PCB backing plate allows the addition of power supply by-pass filtering without changing the layout of the mother board. Selected pins in the LGA may be connected to individual traces on interior planes of the PCB backing plate, or to entire conductive planes rather than mere traces. These traces or planes may then be used to make connections to by-pass capacitors located in out of the way locations, say, around the periphery of the PCB backing plate. Alternatively, the PCB backing plate may be used to simply make available additional mounting area for other original components generally.

2 Claims, 1 Drawing Sheet

BACKING PLATE FOR GATE ARRAYS OR THE LIKE CARRIES AUXILIARY COMPONENTS AND PROVIDES PROBE ACCESS TO ELECTRICAL TEST POINTS

BACKGROUND OF THE INVENTION

Very large scale integration (VLSI) integrated circuits (IC's) such as big gate arrays or application specific IC's (ASIC's) may have several hundred to over one thousand signals on associated signal pins that need to enter or leave the IC. These IC's are generally mounted to printed circuit boards (PCB's). The manner of mounting frequently includes the use of sockets.

By the term "socket" we refer to any of a variety of commercially available high-density low-inductance LGA (see below) sockets supplied by various manufacturers. One such socket uses an array of compressible small "fuzz buttons" or "brillo pads". (Brillo is a brand of steel wool balls or pads, used for cleaning, as in scouring pots and pans in a kitchen.) Each of these balls is a small irregularly wound and inter-twined ball of gold wire. These balls of tangled wire are stuffed through a regular array of holes in a thin sheet of insulative material. The regular array of holes matches the pin out pattern on the IC and the PCB, and registration is achieved by alignment pins (dowel pins). The balls of tangled of wire are compressed between the pads (lands) on the PCB and the corresponding pads or lands (signal pins) on the underside of the IC. Through such compression the fuzzy balls of wire become intervening series connections between the pads on the PCB and those on the IC. If such a socket is used the array of pads is referred to as a land grid array (LGA). To avoid any possibility of confusion is the description that follows, we shall henceforth refer to an "LGA of socket pads" when referring to those lands on the PCB that mate with an LGA socket. There is an industry standard describing what an LGA of socket pads is to look like. If an LGA socket is not used and the part is simply soldered to the PCB, the array is referred to as a ball grid array (BGA).

From the description above it is clear that use of a socket for an LGA requires sufficient compressive force to adequately squeeze all the fuzzy wire balls in the socket against the LGA of socket pads and against the signal pins of the IC. The force required can be significant, and for an IC having eight or nine hundred signal pins it may take four stout screws or small bolts to achieve the requisite force. A companion issue quickly arises. Even though the mother board may be a multi-layer PCB, just a few thousandths of an inch deformation within the region of the LGA can be enough to introduce connectivity problems. Even a multi-layer PCB is typically not stiff enough to sufficiently resist deformation, especially at elevated temperatures. The usual solution for dealing with this issue is to supply a suitably stiff backing plate, or bolster, on the opposite side of the PCB, and then use the screws to compress both the socket and the mother board between the backing plate and the IC. Painted 3/16" aluminum plate with attached threaded studs is a favorite choice for backing plates.

It should not be assumed that backing plates are needed for only LGA sockets of the fuzzy ball type. Other types of LGA sockets can require the use of backing plates, as well.

Now consider the various many signals that go to and from the IC. The vast majority of them are traces on planes (layers) located in the interior of the PCB. To get to the LGA of socket pads on an outside surface they must travel by vias, which start out as holes drilled in the PCB. The most common manufacturing technique is for these holes to go all the way through the board and generate a corresponding pattern of signal vias and their pads on the "back side" of the PCB, away from the IC and next to the backing plate. We shall henceforth refer to these pads on the backside of the PCB as an array or pattern of "signal via pads".

There are several reasons for having the holes for the vias under the LGA of socket pads go all the way through the PCB. Among these is that it facilitates reliable formation of the plating that forms the via. (There are blind hole processes, however. If one of these were used there would be no pattern of signal via pads on the back side of the PCB.) Another reason is that during development standard solid backing plates will sometimes have a small portion removed to allow probing of the IC's signals (as with an oscilloscope probe or probes for a logic or timing analyzer) from the back side of the PCB. These modified backing plates are generally made up on demand, and are best thought of as special tooling. Such probing could not be done if there were no signal via pads on the back side. A coat of enamel paint baked onto the aluminum is often relied upon to provide electrical insulation between the signal via pads on the backside and the conductive aluminum interior of the backing plate. Modification of the backing plate exposes the aluminum. Even if insulation is replaced, probe tips are generally sharp, and in time the possibility of an inadvertent short circuit to the backing plate (whether involving the probe tip or not) cannot be discounted. Certain such short circuits, however brief in duration, could be very damaging.

Even if a modified backing plate is available during a trouble shooting episode, it is a disagreeable task to remove the existing one and replace it with the special one. Aside from the effort, and the wear and tear on the PCB and the IC, there is the uncertainty introduced by the disturbance of disassembly and re-assembly. (Was there a bad connection that is now gone, or is there now a different bad connection, or, was it OK and now it is not?) It would be desirable if the backing plate used for production purposes in the first instance, and shipped as part of the product, were such that it facilitated probing of the IC's signals at the signal via pads, and that home made modified backing plates were thus not necessary.

Now consider yet another issue. As logic circuitry gets faster, circuit density increases and trace geometry on PCB's gets smaller, more attention must be paid to power supply decoupling for the IC's mounted on a PCB. An inadequately by-passed supply can lower margins, or even cause the part to operate incorrectly. For some applications, as in, say, a "mini super computer", the IC's of interest are very large scale (VLSI) IC's with a high number of pins (perhaps seven hundred to a thousand). A multi-layer mother board can be eighteen by twenty-four inches and carry as many as a dozen such VLSI parts. It is not a trivial matter to revise, even slightly, the layout of such a board, say, to either initially include or to later alter power supply by-pass circuits located near or around the periphery of the VLSI part.

Nevertheless, it can happen that after the mother board is laid out the power supply by-pass circuits need to be revisited. There could be several reasons that might serve as occasions for this unwelcome task, even assuming that the original design was not a "mistake". There might be a revision to the VLSI part, causing it to need increased by-passing. A clock rate might have been increased, or a regulatory environment may have changed, requiring an adjustment in RFI abatement strategy. Thus, it is desirable to be able to adjust the power supply by-passing for such a part, but without revisiting the layout of the mother board.

It might also happen that there is simply not as much room as desired on the mother board, and that it would be useful if additional room for component "foot prints" could be found without increasing the size of the mother board.

SUMMARY OF THE INVENTION

A solution to the problem of probing a VLSI IC's signals as they appear at the signal via pads on the back side of the PCB is to use as a backing plate a piece of multi-layer printed circuit board material thick enough to be sufficiently stiff for the purpose. The backing plate has front side pads and vias in at least those locations in the LGA (of signal via pads) corresponding physically to signals that are of interest for probing, and if such a subset is unknown ahead of time, the entire LGA of signal bias pads may be represented in the vias. An LGA socket connects the front side vias of the backing plate to the LGA of signal vias on the back side of the PCB carrying the gate array or other IC. Thus, those signals that, in the absence of a backing plate, could be probed on the back side of the PCB can now still be probed at back side pads on the back side of the backing plate, just as if that were the back side of the PCB. The backing plate can be equipped with captive threaded studs, if desired. Alternatively, it may simply have holes to receive fasteners, or have captive female threaded fasteners in lieu of holes. Special symbols, legends and suitable grid identification axes can be silk screened onto the side of the backing plate that remains visible when installed.

A solution to the problem of adding power supply by-pass filtering for a VLSI part in an existing mother board layout, and without changing that layout, is to take further advantage of the fact that the backing plate is a multi-layer PCB in its own right. That is, selected pins in the LGA may be connected to individual traces on interior planes of the backing plate, or to entire conductive planes rather than mere traces. These traces or planes may then be used to make connections to bypass capacitors located in out of the way locations, say, around the periphery of the backing plate.

Such a backing plate may also be used to mount original components that might not otherwise comfortably fit on the mother board.

DESCRIPTION OF A PREFERRED EMBODIMENT

Figure 1:
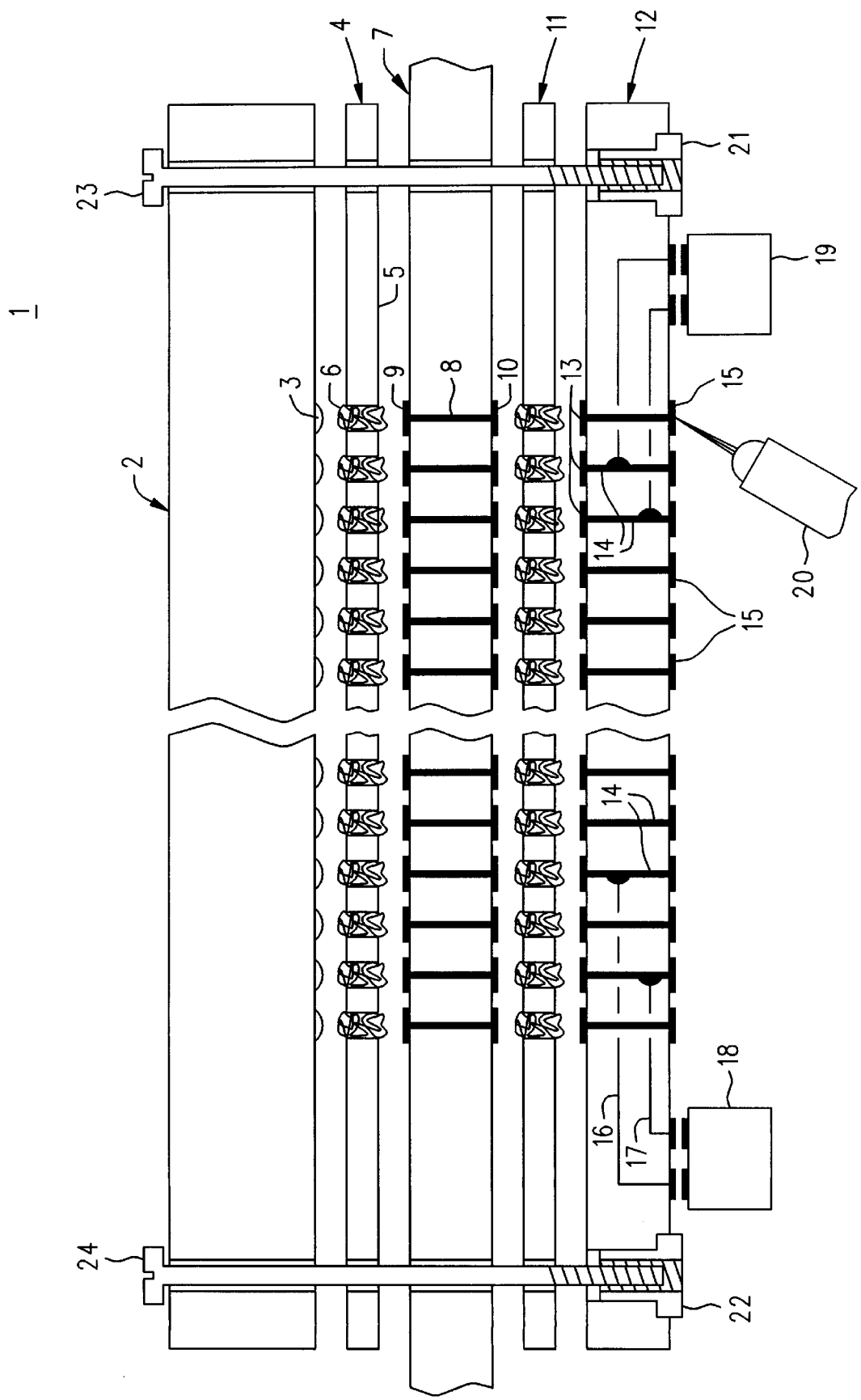
FIG. 1 is a simplified hybrid cross sectional/schematic diagram of a multi-layer PCB backing plate that allows probing of the signal an IC as well as the presence of auxiliary components not mounted to the mother board.

Refer now to FIG. 1, wherein is shown a simplified cross sectional view 1, also partly schematic in nature, of a PCB backing plate 12 for a gate array 2, or the like, mounted to a mother board 7. According to the figure, an IC 2 having an LGA of signal contacts 3 is mounted with the aid of socket 4 to a PCB 7. In this connection the PCB 7, which may be a multi-layer printed circuit board, includes an LGA of socket pads 9. Socket 4 includes an insulative frame 5 having an LGA of apertures, each aperture of which is stuffed with a small ball 6 of tangled gold wire. By means of compression supplied by mounting hardware (e.g., screws 23 and 24, captive nuts 21 and 22), the LGA of signal pins 3 is brought into electrical contact with the LGA of socket pads 9 through the intervening LGA of fuzzy balls 6. Not shown for clarity is an indexing mechanism (e.g., dowel pins and holes therefor) to align the socket 4 and IC 2 into registration with the LGA of socket pads 9.

The LGA of socket pads 9 (on the front side, as it were) has a corresponding LGA of socket pads 10 on the backside of the PCB 7. The two arrays of pads are connected by corresponding vias 8. PCB backing plate 12 (which is simply a multi-layer printed circuit board of suitable length and width, and of sufficient thickness to be stiff enough) also has a front side LGA of socket pads 13 and a back side LGA of probe pads 15, likewise interconnected with a corresponding array of vias 14. Socket 11 performs electrical interconnection between the LGA of socket pads 10 on the back side of PCB 7 and the LGA of socket pads 13 on the front side of PCB backing plate 12. The array of vias 14 allows the signals present at the array of signal contacts 3 on the IC 2 to be probed at the LGA of probe pads 15 by a suitable probe 20.

Also shown in FIG. 1 are optional auxiliary components 18 and 19, which may be surface mounted capacitors. Component 18 is electrically connected in a known manner to selected vias in the array 14 thereof by traces (that may include their own associated vias) 16 and 17. Component 19 is similarly connected. Components 18 and 19 may be disposed around the periphery of the PCB backing plate 12, although they might be placed anywhere there is room (e.g., perhaps the LGA of pads 9, 10, 13 and 15 might not occupy the entire interior surface defined by the edges of that LGA).

I claim:

1. A printed circuit assembly comprising:

a printed circuit board having a front side and a back side, there being a land grid array of socket pads on the front side of the printed circuit board connected by intervening vias to a corresponding land grid array of socket pads on the back side of the printed circuit board;

an integrated circuit disposed on the front side of the printed circuit board proximate the land grid array of socket pads thereon;

a first socket interposed between the integrated circuit and the front side of the printed circuit board;

a printed circuit backing plate having a front side and a back side;

a land grid array of socket pads on the front side of the printed circuit backing plate matching the land grid array of socket pads on the back side of the printed circuit board;

an array of probe pads on the back side of the printed circuit backing plate electrically coupled by vias within the printed circuit backing plate to the land grid array of socket pads on the front side of the printed circuit backing plate;

a second socket interposed between the front side of the printed circuit backing plate and the back side of the printed circuit board; and a plurality of compression fasteners that mount the integrated circuit, the printed circuit backing plate and the first and second sockets to the printed circuit board.

2. A printed circuit assembly as in claim 1 wherein the printed circuit backing plate is a multi-layer printed circuit board further including internal traces that electrically connect selected vias therein to by-pass capacitors soldered to pads along the periphery of the back side of the printed circuit backing plate.

* * * * *